United States Patent [19]

Kozuka et al.

[11] Patent Number: 4,976,517

[45] Date of Patent: Dec. 11, 1990

[54] OPTICAL UNIT INCLUDING ELECTROOPTICAL CRYSTAL ELEMENTS

[75] Inventors: Yoshinari Kozuka; Shogo Kawaguchi, both of Nagoya, Japan

[73] Assignee: NGK Insulators, Ltd., Japan

[21] Appl. No.: 295,356

[22] Filed: Jan. 10, 1989

[30] Foreign Application Priority Data

Jan. 14, 1988 [JP] Japan .................. 63-6297

[51] Int. Cl.$^5$ .................. G02F 1/01; G02F 1/03; G02B 5/30

[52] U.S. Cl. .................. 350/355; 350/356; 350/387

[58] Field of Search ............... 350/387, 388, 355, 356

[56] References Cited

U.S. PATENT DOCUMENTS 3,304,428 2/1967 Peters .................. 350/387 X
3,900,247 8/1975 Zaky .................. 350/387 X

FOREIGN PATENT DOCUMENTS 57-196166 12/1982 Japan .

Primary Examiner—Eugene R. LaRoche
Assistant Examiner—Michael B. Shingleton
Attorney, Agent, or Firm—Arnold, White & Durkee

[57] ABSTRACT

An optical unit including a first electrooptical crystal element having a pyroelectric effect and first polarized faces, and a second electrooptical crystal element having a pyroelectric effect and having second polarized faces corresponding to the first polarized faces. The first and second polarized faces are electrically connected to each other such that a polarity of an electrical charge on each of the first polarized faces is opposite to that of an electrical charge on a corresponding one of the second polarized faces. The first electrooptical crystal element is positioned such that a light beam is propagated through the first electrooptical crystal element.

9 Claims, 5 Drawing Sheets

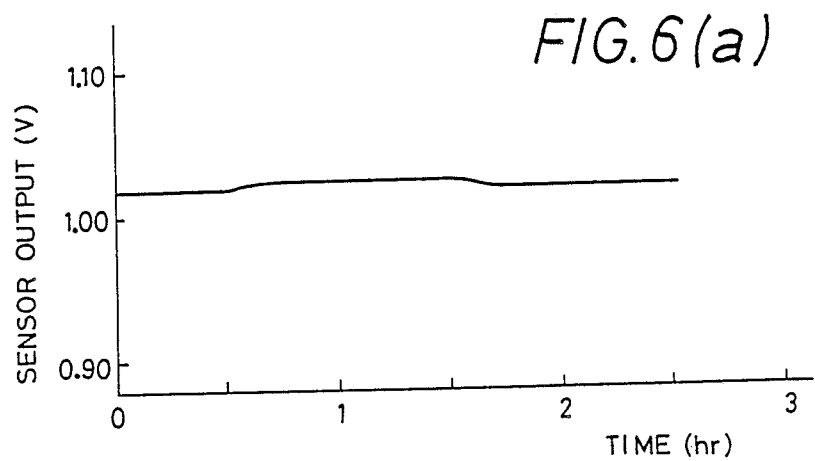
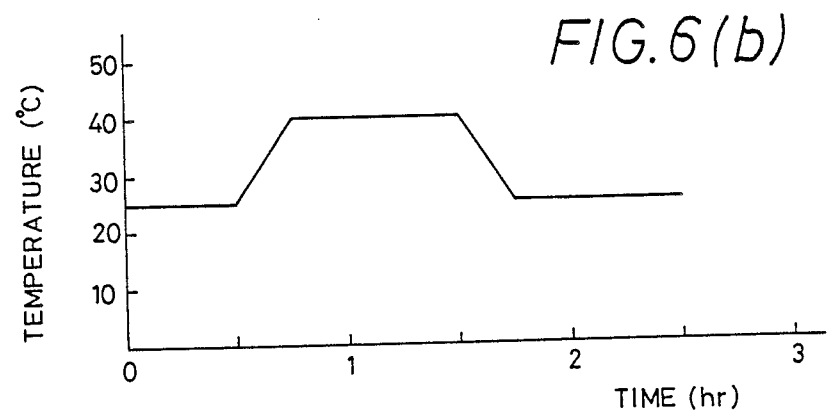

OPTICAL UNIT INCLUDING ELECTROOPTICAL CRYSTAL ELEMENTS

BACKGROUND OF THE INVENTION

1. Field of the Invention

The present invention relates generally to an optical unit which uses crystals having a pyroelectric effect and an electrooptical effect, and more particularly to such an optical unit used for optical devices such as an optical modulator and an optical voltage sensor.

2. Discussion of the Prior Art

There are known optical devices such as optical modulators and optical voltage sensors, which utilize an electrooptical crystal or crystals such as lithium niobate ($LiNbO_3$) having an electrooptical effect. Such optical devices having an electrooptical effect have a generally recognized feature that optical signals produced as the outputs of the devices are electrically insulated, and are less likely to be influenced by static or electromagnetic induction during transmission thereof through an optical signal line. The electrooptical effect is interpreted to mean a phenomenon wherein the refractive index of an electrooptical element is changed with a voltage applied to the element. The optical devices are adapted to effect optical modulation or voltage measurement, utilizing this phenomenon.

As an example of an optical unit utilizing such an electrooptical effect, there is known an optical voltage sensor as shown in FIG. 1, which includes: a light source 1; an optical fiber 2; an electrooptical crystal 3 such as a crystal of $LiNbO_3$; a polarizer 4a; an analyzer 4b; a quarter (¼) waveplate 5; rod lenses 6; a detecting circuit 7 having a photo-detector for converting an optical signal into an electric signal, and a circuit for electrically dividing an AC voltage by a DC voltage; and a pair of electrodes 8 formed on opposite faces of the electrooptical crystal 3. The optical elements 3-6 are directly secured in position by suitable means such as adhesive masses 9, to a surface of a suitable substrate 10, whereby a sensor head is formed.

Where a Pockel's element such as a crystal of $LiNbO_3$ is used as the electrooptical crystal 3, a light beam produced by the light source 1 is propagated through the polarizer 4a and thereby linearly polarized. The linearly polarized beam is then propagated through the electrooptical crystal 3 and thereby elliptically polarized. The elliptically polarized beam is passed through the quarter waveplate 5 and analyzer 4b. The quantity of the light beam emitted from the sensor head is determined by the ellipticity of the elliptically polarized beam emitted from the electrooptical crystal 3, which ellipticity is changed with a voltage applied between the electrodes 8 formed on the electrooptical crystal 3. Consequently, the voltage applied to the electrooptical crystal 3 can be measured by detecting the quantity of the elliptically polarized beam produced by the sensor head.

Where a crystal such as $LiNbO_3$ or $LiTaO_3$ having pyroelectric effect is used as the electrooptical crystal 3 having an electrooptical effect, it was recognized that the output of the electrooptical crystal 3 used as an optical element of the optical unit as indicated above tends to fluctuate due to a variation in the ambient temperature.

In light of the above problem, laid-open Publication No. 57-196166 of unexamined Japanese Patent Application proposes the provision of a pair of electrically conductive films formed on two Z-faces of the electrooptical crystal which are opposed to each other in the direction of the Z axis of the crystal. The two conductive films are electrically connected to each other, so that electrical charges produced on the two Z-faces of the electrooptical crystal are discharged in order to avoid an electric field due to the electrical charges, and thereby eliminate a resulting measuring error of the optical unit.

SUMMARY OF THE INVENTION

It is therefore an object of the present invention to provide an optical unit having an electrooptical effect, which exhibits consistent operating characteristics even in the presence of a variation in the ambient temperature, by means of an arrangement quite different from that proposed in the laid-open publication identified above, for obviating electrical charges of an electrooptical crystal due to the ambient temperature variation.

The above object may be accomplished according to the principle of the present invention, which provides an optical unit comprising (a) a first electrooptical crystal element having a pyroelectric effect and first polarized faces, (b) a second electrooptical crystal element having a pyroelectric effect and having second polarized faces corresponding to the first polarized faces, and (c) electrically connecting means for electrically connecting the first and second polarized faces such that a polarity of an electrical charge on each of the first polarized faces is opposite to that of an electrical charge on a corresponding one of the second polarized faces. The first electrooptical crystal element is positioned such that a light beam is propagated through the first electrooptical crystal element. According to the instant arrangement, the electrical charge produced on each one of the first polarized faces of the first crystal element is discharged by the opposite electrical charge produced on the corresponding one of the second polarized faces of the second crystal element.

A careful investigation on a variation or fluctuation in the characteristics of an optical element consisting of an electrooptical crystal indicates that such a phenomenon occurs when the ambient temperature of the optical element rises and falls, and that the fluctuation or instability of the characteristics of the element is reduced when the ambient temperature change takes place at a relatively low rate.

It is presumed that the above phenomenon, i.e., an error in an optical output of the electrooptical crystal, is caused by a variation in the potential between the oppositely polarized faces of the crystal upon changing of the ambient temperature, namely, due to positive and negative electrical charges produced on the polarized faces. The electrical charges create an electric field different from a nominal electric field to which the electrooptical crystal is exposed for measurement of an electrical signal or parameter.

The above problem has been solved according to the present invention, which utilizes a second electrooptical crystal or crystal element in addition to a conventionally provided first electrooptical crystal. The second polarized faces of the second crystal or crystal element are electrically connected to the corresponding first polarized faces of the first crystal, such that the electrically connected corresponding first and second polarized faces of the first and second crystals have electrical charges whose polarities are opposite to each other.

Therefore, the electrical charges produced on the corresponding first and second polarized faces are effectively discharged with each other.

Each of the first and second electrooptical crystal elements used according to the present invention consists of a crystal or a portion of a crystal, such as LiNbO$_3$ or LiTaO$_3$, which has a pyroelectric effect as well as an electrooptical effect.

To minimize the fluctuation of the operating characteristics of the instant optical unit, more particularly the operating characteristics of the first electrooptical crystal element, it is desirable that the amounts of the positive and negative electrical charges produced on the corresponding first and second polarized faces of the two crystal elements due to the varying ambient temperature be substantially the same, such that the positive and negative charges are almost discharged so as to eliminate an undesirable electric field. To this end, it is preferred that the first and second crystal elements be disposed relatively adjacent to each other, so that the two elements are subjected to the same ambient temperature.

In particular, it is preferred that the first and second electrooptical crystal elements are formed of the same material, and that the first polarized faces of the first crystal element have the same surface areas as the second polarized faces of the second crystal elements, so that the amounts of the electrical charges produced on these first and second polarized faces upon changing of the ambient temperature may be substantially the same.

For example, the electrical connection of the first and second electrooptical crystal elements may be effected as follows. Initially, the first and second electrooptical crystal elements are joined together in a mutually superposed relationship to each other such that the polarity of the electrical charge on one of the opposite first polarized faces of the first crystal element is opposite to that on the corresponding one of the opposite second polarized faces of the second crystal element, which corresponding second polarized face is positioned on the same side of the joined structure of the first and second crystal elements, as the above-indicated first polarized face. Then, an electrically conductive film is formed on each of the opposite surfaces of the joined structure which includes the corresponding first and second polarized faces, so that these first and second polarized faces are electrically connected to each other by the conductive film formed thereon.

The instant optical unit including the first and second electrooptical crystal elements may be suitably used for various applications, for example, as electrooptical elements for optical modulators for optical communication, for optical voltage sensors having high signal insulating reliability, and for SHG (second harmonic generation).

BRIEF DESCRIPTION OF THE DRAWINGS

The above and optional objects, features and advantages of the present invention will be better understood by reading the following detailed description of the invention, when considered in conjunction with the accompanying drawings, in which:

FIGS. 5(a) and 6(a) are graphs indicating outputs of the optical voltage sensors of FIGS. 1 and 2, which were produced in experiments of Example 1; and FIGS. 5(b) and 6(b) are graphs showing temperature variations of the optical voltage sensors.

DETAILED DESCRIPTION OF THE INVENTION

Figure 2:
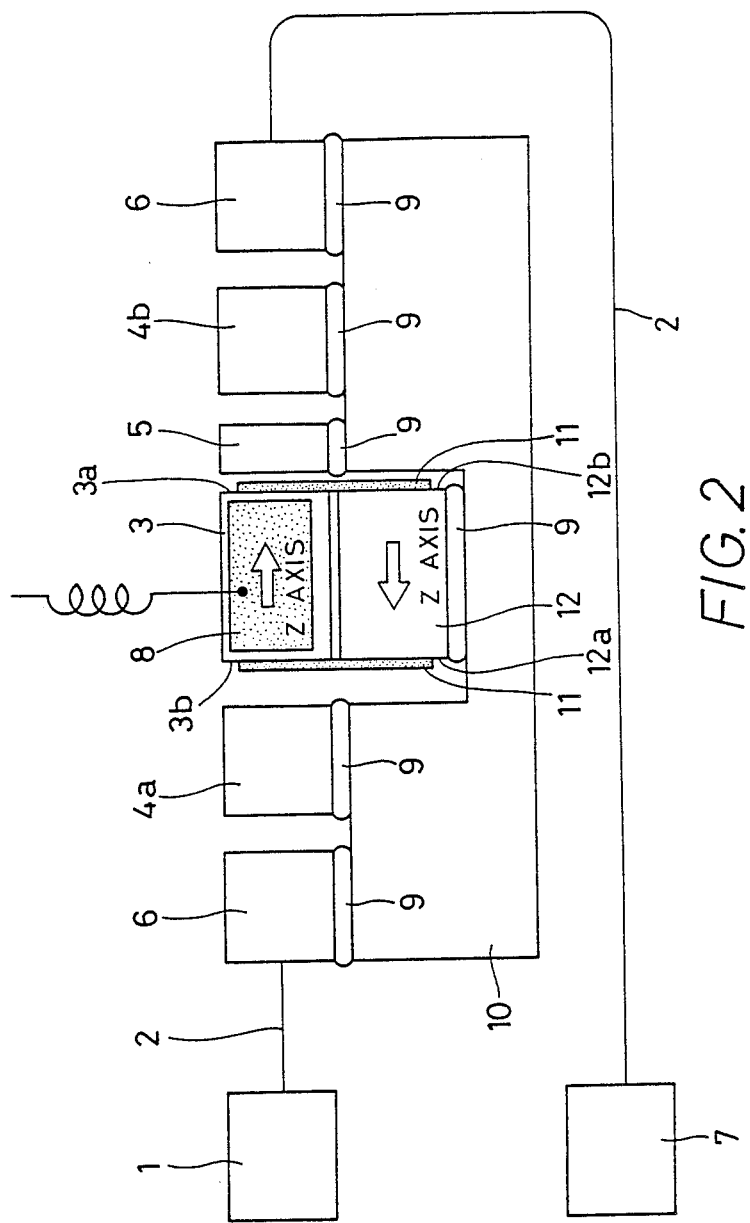
FIG. 2 is a schematic view showing an arrangement of an example of an optical voltage sensor which uses optical elements according to one embodiment of the present invention.

Referring first to FIG. 2, there is illustrated an example of an optical voltage sensor using optical elements that are electrically connected as described above. This optical voltage sensor uses crystals of LiNbO$_3$ as a first and a second electrooptical crystal 3, 12, which are polarized in the direction of their Z axes (C axes). The first and second electrooptical crystals 3, 12 are joined together such that the direction of the Z axis of the second crystal 12 on which the first crystal 3 is superposed is opposite to the direction of the Z axis of the first crystal 3. Two faces of the thus joined crystal body which are opposite to each other in the direction of the Z axes of the crystals 3, 12 provide a pair of polarized surfaces. On each of these two polarized surfaces, the polarity of an electrical charge produced on a first part 3a, 3b provided by the first electrooptical crystal 3 is opposite to that of an electrical charge produced on a second part 12a, 12b provided by the second electrooptical crystal 12. The first part 3a, 3b of the first crystal 3 is electrically connected to the second part 12a, 12b of the second crystal 12 by an electrically conductive film 11. Thus, the instant optical voltage sensor incorporates a crystal body which consists of the joined first and second electrooptical crystals 3, 12 whose opposite Z-axis faces 3a, 12b, 3b, 12a are covered by the respective electrically conductive films 11. The crystal body 3, 12 is directly secured in position to a suitable substrate 10 by a suitable adhesive 9, as indicated in FIG. 2, whereby an optical sensor head is constituted.

Figure 1:
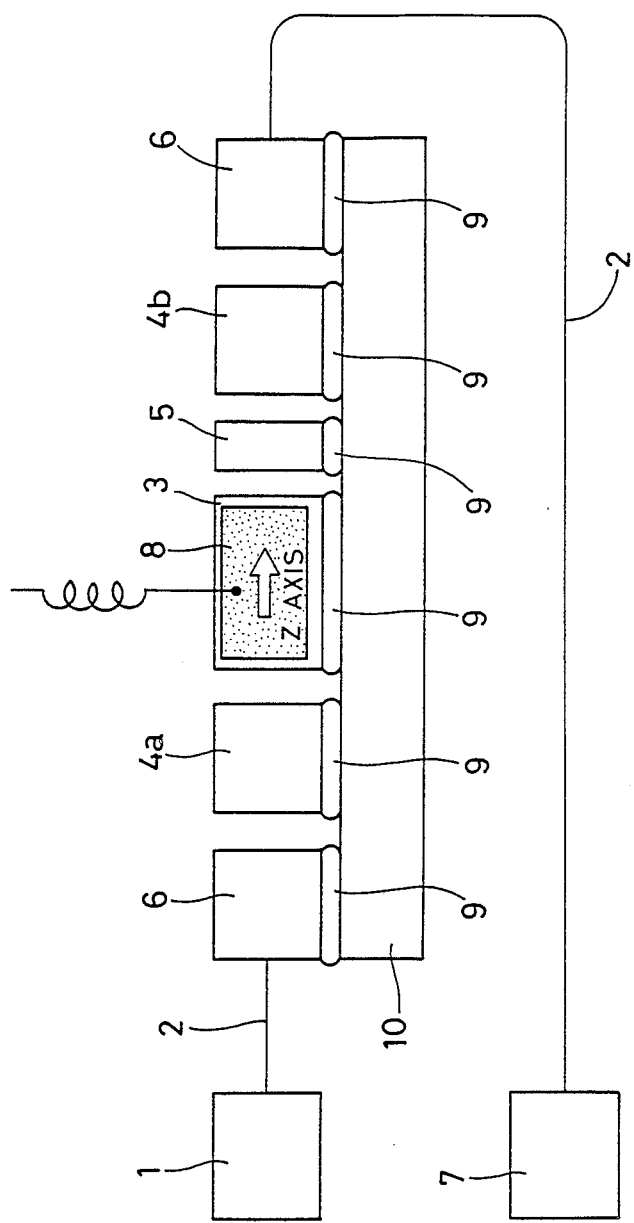
FIG. 1 is a schematic view showing an arrangement of one example of an optical voltage sensor which uses known optical elements.

Since the other elements of the instant optical sensor of FIG. 2 are identical to those of the sensor of FIG. 1, no redundant description of these elements is provided herein, in favor of the same reference numerals used in these two figures to identify the identical elements.

In the instant example of FIG. 2, the crystal body 3, 12 is positioned such that the above-indicated pair of polarized surfaces of the crystal body 3, 12 are opposite to each other in the direction of propagation of a light beam, so that the light beam is propagated through the first parts 3a, 3b of the polarized surfaces of the crystal body which are provided by the first electrooptical crystal 3. Consequently, the electrically conductive films 11 are preferably formed of a light-transparent electrically conductive material such as InO$_2$, SnO$_2$, Al or Au.

The properties or characteristics of an electrooptical crystal are sensitively changed with a magnitude of a stress exerted thereon. According to a conventionally practiced method of securing an electrooptical crystal to a substrate, a stress is exerted on the electrooptical crystal due to a difference in coefficient of thermal expansion between the crystal and the substrate, when the ambient temperature changes. Therefore, the characteristics of the electrooptical crystal of the conventional optical unit are changed due to a change in the ambient temperature. This conventionally experienced drawback is not encountered in the instant optical voltage sensor of FIG. 2, because the first electrooptical crystal 3 through which the light beam is propagated is supported by the second electrooptical crystal 12 which is not placed in the optical path of the sensor. While the second electrooptical crystal 12, secured to the substrate 10 by the adhesive 9, is subjected to a strain due to its difference in thermal expansion coefficient with respect to the substrate upon changing of the ambient temperature, the stress is not significantly transferred to the first electrooptical crystal 3. Consequently, the first crystal 3 exhibits relatively consistent or stable operating characteristics at the varying ambient temperature of the sensor.

Figure 3:
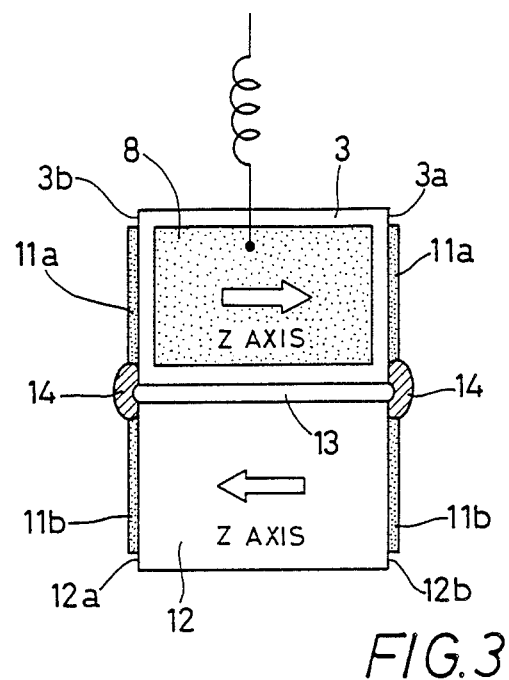
FIGS. 3 and 4 are front elevational views of other embodiments of the optical elements of the invention.

The manner of electrical connection of the first and second electrooptical crystals 3, 12 is not limited to that described above. For instance, the first and second crystals 3, 12 may be electrically connected as illustrated in FIG. 3, wherein the first parts 3a, 3b of the polarized surfaces provided by the first crystal 3 are covered by respective first electrically conductive films 11a, 11b, while the second parts 12a, 12b of the polarized surfaces provided by the second crystal 12 are covered by respective second electrically conductive films 11b. The first and second crystals 3, 12 with the films 11a, 11b are subsequently joined together by a suitable adhesive 13 such as a synthetic resin, such that the polarity of an electrical charge on the first part 3a, 3b of each polarized surface of the crystal body 3, 12 is opposite to that of an electrical charge on the second part 12a, 12b, namely, such that the directions of the Z axes of the first and second crystals 3, 12 are opposite to each other. Then, the films 11a, 11b on one of the opposite polarized surfaces of the crystal body 3, 12 are electrically connected by an electrically conductive shorting material 14 similar to the material of the films 11a, 11b. Similarly, the films 11a, 11b on the other polarized surface of the crystal body 3, 12 are electrically connected by another electrically conductive shorting material 14.

That is, any suitable manner may be employed for electrically connecting the first and second parts 3a, 12a, 3b, 12b of each of the opposite polarized surfaces of the crystal body 3, 12, which first and second parts are provided by the first and second electrooptical crystals 3, 12, respectively.

Further, the first and second electrooptical crystals may be positioned in spaced-apart relation with each other and their first and second parts 3a and 12b, 3b and 12a of the polarized surfaces are electrically connected by suitable conductive wires or other conductors such that the first and second parts have the same area. Such electrical connections of the polarized surfaces by using conductors are applicable to an integrated assembly which has a plurality of sensor heads using electrooptical crystals other than the first and second crystals 3, 12 described above.

While each of the first and second electrooptical crystals 3, 12 consists of a single crystal, it is possible to use a single crystal having ferroelectric domains each having opposite faces which have substantially the same surface areas and whose polarities of electrical charges are opposite to each other. For example, an electrooptical crystal 15 as shown in FIG. 4 may be used to provide two electrooptical crystal elements whose oppositely polarized surfaces are electrically connected.

Figure 4:
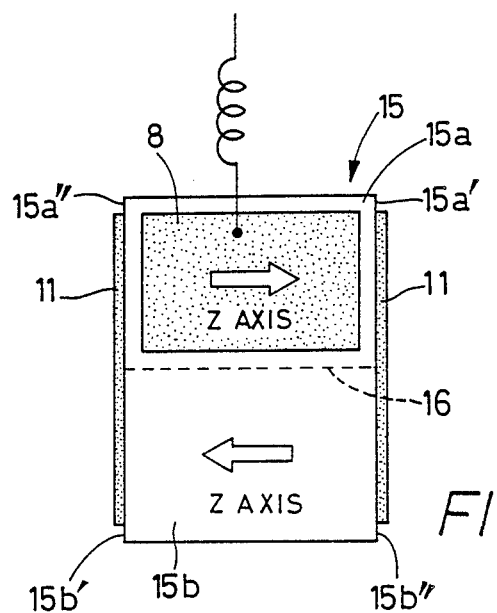

Described more specifically, the electrooptical crystal 15 shown in FIG. 4 is a single crystal which consists of two equal parts or halves 15a, 15b functionally divided by a domain boundary 16, the first and second halves 15a, 15b functionally corresponding to the first and second crystals 3, 12 of the preceding examples of FIGS. 2 and 3, respectively. This integral crystal 15 is formed such that the direction of the Z axis of the first half 15a is opposite to that of the second half 15b, so that the first and second parts 15a' and 15b''', 15a'' and 15b' on the same polarized surface of the crystal 15 have the opposite polarities of electrical charges and are electrically connected by the electrically conductive film 11 formed on each polarized surface of the crystal 15, as in the preceding examples. On opposite faces of the first half 15a of the crystal 15 perpendicular to the polarized surfaces 15a', 15a''', 15b', 15b'', there are formed a pair of electrodes 8, so that the light beam passing through the first half 15a is subjected to an electric field produced by the electrodes 8.

In the present arrangement using the single electrooptical crystal 15 having the first and second halves 15a, 15b, the two electrooptical crystal elements or ferroelectric domains 15a, 15b may be easily electrically connected at the polarized surfaces, by simply forming the electrically conductive films 11 on the opposite polarized surfaces of the crystal 15. Thus, the electrical connecting procedure is simplified.

EXAMPLES

To further clarify the concept of the present invention, presently preferred examples of the invention will be specifically described. However, it is obvious that the invention is not limited to the details of these examples.

Further, it is to be understood that various changes, modifications and improvements which may occur to those skilled in the art may be made in the examples given below and in the details of the embodiments of the invention described above, without departing from the spirit of the invention.

EXAMPLE 1

As a comparative example, the optical voltage sensor of FIG. 1 was prepared, using a LiNbO$_3$ crystal as the electrooptical crystal 3 having a pyroelectric effect. The LiNbO$_3$ crystal 3 having the pyroelectric effect is polarized in the direction of the Z axis so that electrical charges are produced on opposite Z-axis faces or Z planes which are opposed to each other in the Z-axis direction. The crystal 3 has dimensions of 2 mm×5 mm×4 mm (Z-axis dimension=5 mm), and opposite X-axis faces or X planes of 5 mm×4 mm. The electrodes 8 were formed on the X planes. The optical elements 3–6 including this crystal 3 were bonded to the ceramic substrate 10 with a resin adhesive. The crystal 3 was positioned so that a light beam is propagated through the crystal 3 in the Z-axis direction. Thus, the optical voltage sensor head was prepared.

Figure 5A:
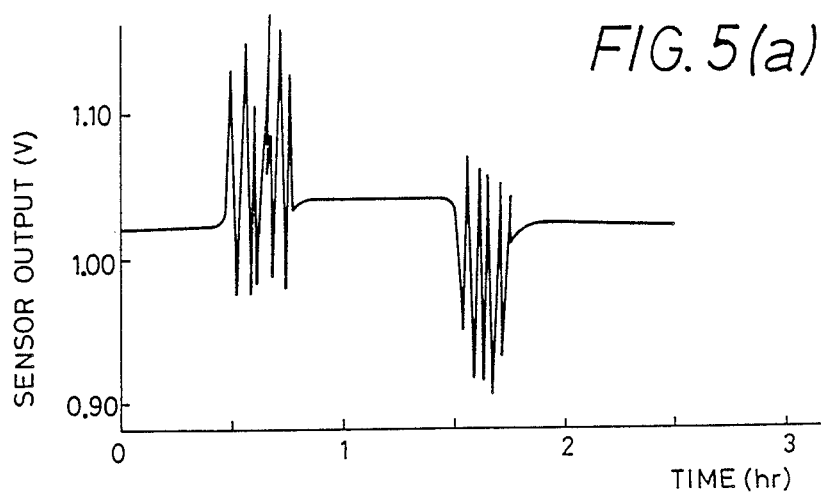
Figure 5B:
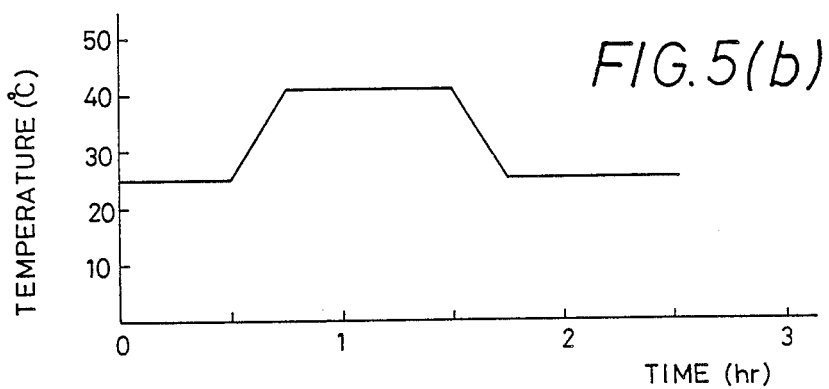

To test the voltage sensor for the temperature characteristics, the sensor head was placed in a thermostat, and the outputs of the sensor were measured at different temperatures, with 60V applied to the electrodes 8 of the electrooptical crystal 3. The output of the sensor was substantially constant (output variation was within ±0.2%) while the temperature in the thermostat was 25° C. However, the voltage sensor exhibited a considerable irregular variation of more than 10% in the output level, when the thermostat temperature was raised from 25° C. to 40° C. at a rate of 1° C./min. The output level of the sensor was stabilized (output variation was within ±0.2%) while the thermostat temperature was then kept at 40° C. The thermostat temperature was subsequently lowered down to 25° C., to check the sensor for the output variation. In this temperature lowering process, the sensor output considerably fluctuated (output variation was more than 10%). The output level of the voltage sensor was recorded on a recorder. The record is shown in the graph of FIG. 5(a), and the temperature change within the thermostat is shown in the graph of FIG. 5(b). It will be understood from these graphs that the variation in the sensor output during the temperature rise had a reversed tendency with respect to that during the temperature fall.

The optical voltage sensor of FIG. 2 was prepared by using two LiNbO$_3$ crystals having the same dimensions of 2 mm×5 mm×4 mm. The two LiNbO$_3$ crystals were bonded together at the 2 mm×5 mm faces or planes with an epoxy resin, such that the direction of the Z axis of one of the two crystals was opposite to the direction of the Z axis of the other crystal. Then, the transparent electrically conductive films 11 of InO$_2$ were formed on the opposite Z planes of the two crystals, whereby the Z planes of the two crystals were electrically connected. The joined crystal structure was bonded at the lower crystal to the substrate 10 with a resin adhesive, so that a light beam is propagated through the upper crystal. Thus, the optical voltage sensor head was prepared.

As in the case of the sensor head of FIG. 1, the thus prepared sensor head was placed in the thermostat, and 60V was applied to the electrodes 8, to test the voltage sensor of FIG. 2 for the temperature characteristics. The sensor output was substantially constant (output variation within ±0.2%) while the thermostat temperature was kept at 25° C. The output variation was held within ±0.2% even while the thermostat temperature was raised from 25° C. up to 40° C. at a rate of 1° C./min. Further, the sensor output during the temperature fall was also found to be stable (output variation within ±0.2%). The output of the instant voltage sensor is shown in the graph of FIG. 6(a), and the temperature change is shown in FIG. 6(b).

The two optical voltage sensors of FIGS. 1 and 2 were further tested by raising and lowering the thermostat temperature between 0° C. and 60° C. in 10° C. steps, at a rate of 1° C./min. The temperature was held for 30 min. at each of 0° C., 10° C., 20° C., 30° C., 40° C., 50° C. and 60° C. The maximum and minimum output levels of the sensors were measured during the temperature change. While the output variation of the conventional sensor of FIG. 1 was as large as 5%, the output variation of the sensor of FIG. 2 according to the present invention was as small as 1%. Thus, the instant sensor demonstrated a remarkably improved result in terms of the output variation, because of reducing stress of the LiNbO$_3$ crystal.

EXAMPLE 2

The optical voltage sensor was prepared by replacing the joined crystal structure of FIG. 2 with the joined crystal structure of FIG. 3 according to the present invention. The crystal structure of FIG. 3 was prepared by using a LiNbO$_3$ crystal wafer having a thickness of 5 mm and a diameter of 3 inches. The wafer has opposite Z planes which are covered by transparent electrically conductive films of InO$_2$. The wafer was sliced into 2 mm×5 mm×4 mm crystals (having 2 mm×4 mm Z-axis faces and 5 mm×4 mm X planes). Two of these LiNbO$_3$ crystals were bonded together with an epoxy resin such that the directions of the Z axes of the two crystals were opposite to each other. Then, the electrically conductive films on the Z planes of the two crystals were electrically connected by the shorting material 14. The electrodes 8 were then formed on the opposite X planes of the upper LiNbO$_3$ crystal. Thus, the sensor head was prepared.

As in Example 1, the prepared sensor head was placed in the thermostat, and 60V was applied to the electrodes 8, to test the voltage sensor for the temperature characteristics. The sensor output was substantially constant (output variation within ±0.2%) while the thermostat temperature was kept at 25° C. Further, the sensor output was kept stable (output variation within ±0.2%) while the thermostat temperature was raised from 25° C. to 40° C. at a rate of 1° C./min. The sensor output during the temperature fall was also found stable (output variation within ±0.2%).

EXAMPLE 3

A LiNbO$_3$ crystal was grown according to the Czochralski process, and a LiNbO$_3$ wafer having a thickness of 5.4 mm and a diameter of 3 inches was cut from the grown crystal, such that the wafer had opposite Z planes. The wafer was subjected to an acid etching treatment, and the surfaces of the wafer were observed for etched pits. The wafer was further observed for the Z-axis direction. The observation revealed that the wafer had distinct local sections whose Z-axis directions are different. A portion of the crystal wafer including the two adjacent local sections having the opposite Z-axis directions was cut to provide a crystal of 2 mm×5.4 mm×8 mm, such that the two local sections or domains had the same volume. The Z planes of the obtained crystal were optically polished. Thus, there was prepared the 2 mm×5 mm×8 mm crystal structure 15 shown in FIG. 4, which has the 2 mm×8 mm Z planes and the 5 mm×8 mm X planes. The transparent electrically conductive films 11 were formed on the Z planes. Subsequently, the electrodes 8 were formed on the X planes. The thus prepared electrooptical structure 15 of FIG. 4 was used in place of the electrooptical structure of FIG. 2.

As in the preceding examples, the temperature characteristics of the optical voltage sensor of FIG. 4 were observed. Namely, the sensor head was placed in the thermostat, and the output of the optical voltage sensor was measured at different temperatures with 60V applied to the electrodes 8. The sensor output was substantially constant (output variation within ±0.2%) while the thermostat temperature was kept at 25° C. The sensor output was comparatively stable, i.e., the output variation was held within ±1%, when the thermostat temperature was raised from 25° C. to 40° C. at a rate of 1° C./min. The sensor output was also stable (output variation within ±1%) when the temperature was lowered to 25° C. While the temperature characteristics of the instant sensor of FIG. 4 during the temperature change were more or less unstable as compared with those of the sensors of Examples 1 and 2 according to the invention, this tendency was presumed to arise from a difference between the amounts of electrical charges produced on the Z-axis faces 15a', 15a'' of the first half 15a of the crystal structure 15, and the Z-axis faces 15b', 15b'' of the second half 15b.

What is claimed is:
1. An optical unit, comprising:

a first pyroelectric, electrooptical crystal element having first polarized faces;

a second pyroelectric, electrooptical crystal element having second polarized faces which each correspond to one of said first polarized faces, said second crystal element and said first crystal element being positioned such that a light beam is propagated through only one of said second crystal element and said first crystal element, wherein said second crystal element is formed of a substantially same material and has a substantially same surface area as said first crystal element; and electrically connecting means for electrically connecting said first polarized faces and said second polarized faces such that a polarity of an electrical charge on each of said first polarized faces is opposite to that of a polarity of an electrical charge on a corresponding one of said second polarized faces;

wherein substantially equal amounts of positive and negative electrical charges are produced on the corresponding first and second polarized faces due to a variation in the ambient temperature of said first crystal element and said second crystal element, said electrically connecting means operating to discharge the positive and negative electrical charges on the corresponding first and second polarized faces.

2. The optical unit of claim 1, wherein said first crystal element is disposed adjacent said second crystal element.

3. The optical unit of claim 2, wherein said first crystal element and said second crystal element each correspond to a first and second portion of a single crystal.

4. The optical unit of claim 2, wherein said first crystal element and said second crystal element are joined together.

5. The optical unit of claim 2, wherein said electrically connecting means consists of a pair of electrically conductive films formed on the corresponding first and second polarized faces.

6. The optical unit of claim 5, wherein said first polarized faces and said second polarized faces are perpendicular to the direction of propagation of the light beam, and said pair of electrically conductive films being formed of a light-transparent electrically conductive material.

7. The optical unit of claim 1, wherein said first crystal element is spaced apart from said second crystal element, said electrically connecting means consisting of a pair of electrical conductors for connecting the corresponding first and second polarized faces.

8. The optical unit of claim 1, wherein said first crystal element and said second crystal element are formed of respective crystals of $LiNbO_3$ and $LiTaO_3$.

9. The optical unit of claim 1, wherein said first crystal element and said second crystal element are formed of a crystal selected from the group consisting of $LiNbO_3$ and $LiTaO_3$.

* * * * *